(12) United States Patent
Gann et al.

(10) Patent No.: US 7,714,426 B1
(45) Date of Patent: May 11, 2010

(54) BALL GRID ARRAY PACKAGE FORMAT LAYERS AND STRUCTURE

(76) Inventors: Keith Gann, 2370 Burnham Dr., Tustin, CA (US) 92782; W. Eric Boyd, 39 Albergar, San Clemente, CA (US) 92672

( * ) Notice: Subject to any disclaimer, the term of this patent is extended or adjusted under 35 U.S.C. 154(b) by 0 days.

(21) Appl. No.: 11/825,643

(22) Filed: Jul. 7, 2007

(51) Int. Cl.
*H01L 23/48* (2006.01)

(52) U.S. Cl. ............... 257/690; 257/693; 257/700; 257/703; 257/730; 257/734; 257/773; 257/787; 257/E23.015; 257/E23.019; 438/106; 438/109

(58) Field of Classification Search ......... 257/678–734, 257/777–796, E23.001–E23.194, E25.005, 257/E25.006, E25.021, E25.027, E23.085; 438/109, FOR. 368, FOR. 426
See application file for complete search history.

(56) References Cited

U.S. PATENT DOCUMENTS

| | | | |
|---|---|---|---|
| 4,672,737 A | 6/1987 | Carson et al. | |
| 5,043,794 A * | 8/1991 | Tai et al. | 257/686 |
| 5,306,948 A * | 4/1994 | Yamada et al. | 257/690 |
| 5,332,922 A | 7/1994 | Oguchi et al. | |
| 5,334,857 A * | 8/1994 | Mennitt et al. | 257/48 |
| 5,347,428 A | 9/1994 | Carson | |
| 5,440,171 A | 8/1995 | Miyano et al. | |
| 5,484,959 A | 1/1996 | Burns | |
| 5,551,629 A | 9/1996 | Fujimoto | |
| 5,677,569 A | 10/1997 | Choi et al. | |
| 5,688,721 A | 11/1997 | Johnson | |
| 5,696,031 A | 12/1997 | Wark | |
| 5,744,827 A | 4/1998 | Jeong et al. | |
| 5,786,237 A * | 7/1998 | Cockerill et al. | 438/109 |
| 5,866,953 A * | 2/1999 | Akram et al. | 257/790 |
| 5,973,403 A | 10/1999 | Wark | |
| 6,023,098 A * | 2/2000 | Higashiguchi et al. | 257/712 |
| 6,028,352 A | 2/2000 | Eide | |
| 6,081,026 A | 6/2000 | Wank | |
| 6,303,992 B1 | 10/2001 | Van Pham | |
| 6,323,060 B1 | 11/2001 | Isaak | |
| 6,365,978 B1 | 4/2002 | Ibnabdeljalil | |
| 6,376,906 B1 * | 4/2002 | Asai et al. | 257/698 |
| 6,339,416 B1 | 10/2003 | Akram | |
| 6,734,567 B2 * | 5/2004 | Chiu et al. | 257/778 |
| 6,787,921 B2 | 9/2004 | Huang | |
| 6,818,977 B2 | 11/2004 | Poo | |

(Continued)

FOREIGN PATENT DOCUMENTS

JP  1991-501428  4/1993

(Continued)

OTHER PUBLICATIONS

Office Action issued in Japanese Patent Application No. 2005-507894 drafted on May 18, 2009 and mailed on May 26, 2009 (*English translation provided*).

(Continued)

*Primary Examiner*—Jasmine J Clark (57) ABSTRACT

Layers suitable for stacking in three dimensional, multi-layer modules are formed by interconnecting a ball grid array electronic package to an interposer layer which routes electronic signals to an access plane. The layers are under-filled and may be bonded together to form a stack of layers. The leads on the access plane are interconnected among layers to form a high-density electronic package.

29 Claims, 6 Drawing Sheets

U.S. PATENT DOCUMENTS

| | | |
|---|---|---|
| 6,967,411 B2 | 11/2005 | Eide |
| 7,242,082 B2 | 7/2007 | Eide |
| 2002/0048849 A1 | 4/2002 | Isaak |
| 2002/0061665 A1 | 5/2002 | Batinovich |
| 2002/0076919 A1 | 6/2002 | Peters et al. |
| 2002/0094603 A1 | 7/2002 | Isaak |
| 2002/0105083 A1 | 8/2002 | Sun |
| 2003/0043650 A1 | 3/2003 | Kato et al. |
| 2003/0173673 A1 | 9/2003 | Val |
| 2003/0232460 A1 | 12/2003 | Poo et al. |
| 2004/0012078 A1 | 1/2004 | Hortaleza |

FOREIGN PATENT DOCUMENTS

| | | |
|---|---|---|
| JP | 2001-085606 | 3/2001 |
| JP | 2001-223325 | 8/2001 |
| JP | 2003-188312 | 7/2003 |
| WO | WO92/06904 | 4/1992 |
| WO | WO 98/31738 | 7/1998 |
| WO | WO 03/038861 | 5/2003 |

OTHER PUBLICATIONS

Supplementary European Search Report for European Patent Application No. 03818224.2 dated Oct. 28, 2009.

Final Office Action for Japanese Patent Application 2005-507894 dispatched on Oct. 27, 2009 (*English translation provided*).

\* cited by examiner

BALL GRID ARRAY PACKAGE FORMAT LAYERS AND STRUCTURE

BACKGROUND OF THE INVENTION

1. Field of the Invention

The present invention relates to the dense packaging of electronic circuitry and specifically to the stacking of ball grid array (BGA) format integrated circuit packages. The invention is also suitable for the stacking of fine ball grid array (FBGA) integrated circuit packages, micro-ball grid array packages and for bump-bonded bare die to form stackable layers which can be combined to form multi-layer electronic modules.

2. Description of the Background Art

The electronics industry continues to seek smaller, denser electronic packaging. An important advance in this regard has been the use of three-dimensional packaging techniques using stacked bare or packaged integrated circuit die.

Most of the background art disclosures describe methods of stacking multiple unpackaged IC chips. Oguchi et al., U.S. Pat. No. 5,332,922, Miyano et al., U.S. Pat. No. 5,440,171, and Choi et al., U.S. Pat. No. 5,677,569, disclose methods of stacking IC chips within a single package. Jeong et al., U.S. Pat. No. 5,744,827 discloses a new type of custom chip packaging which permits stacking, but which does not allow the use of off-the-shelf packaged IC's. Burns, U.S. Pat. No. 5,484,959 shows a method of stacking TSOP packages which requires multiple leadframes attached above and below each TSOP and a system of vertical bus-bar interconnections, but which does not conveniently allow an expansion of the number of vertically interconnecting leads.

The assignee of this application, Irvine Sensors Corporation, has been a leader in developing high-density packaging of IC chips, for use in focal plane modules and for use in a variety of computer functions such as electronic memory. Examples of Irvine Sensors Corp.'s high-density electronic packaging are disclosed in U.S. Pat. No. 4,672,737, to Carson, et al.; U.S. Pat. No. 5,551,629, to Carson et al.; U.S. Pat. No. 5,688,721, to Johnson; U.S. Pat. No. 5,347,428 to Carson, et al.; and U.S. Pat. No. 6,028,352 to Eide, all of which are fully incorporated herein.

The present invention relates to the stacking of layers containing integrated circuit chips (ICs), thereby obtaining high-density electronic circuitry. In general, the goal of the present invention is to combine high circuit density with reasonable cost. A unique aspect of this invention is that it provides a low cost method of stacking commercially available IC's in BGA packages while allowing the independent routing of several non-common I/O (input/output) signals from upper-level layers to lower layers or to the bottom of the stack. Cost reduction is accomplished by utilizing relatively low cost interposer boards as appropriate to reroute leads to an access plane and by the ability to stack pre-packaged and pre-tested off-the-shelf BGA packages.

None of the background art addresses the need for compact, dense microelectronic stacks that take advantage of the high speed and small outline of a BGA package that are low cost and highly reliable and incorporate known good die (KGD), each aspect of which the instant invention addresses.

SUMMARY OF THE INVENTION

The present invention provides stackable layers which may be interconnected to form a high-density electronic module. This application further discloses a stack of layers electrically interconnected in the vertical direction, suitable for mounting onto a PCB (printed circuit board) or other electronic device. This application further discloses a method for starting with standard BGA packages and manufacturing a stacked IC-containing package using interposer interconnections which are routed in the vertical direction along one or more access planes.

The invention generally consists of BGA packaged die that are electrically interconnected to conductive traces which terminate on an access edge. The conductive traces that terminate at the access edges are electrically rerouted to the desired locations in the stack to allow the interconnection of several non-common signals (e.g., chip enable and/or data lines) from an upper layer to a lower layer of a stack of layers.

DETAILED DESCRIPTION OF THE INVENTION

Figure 1A:
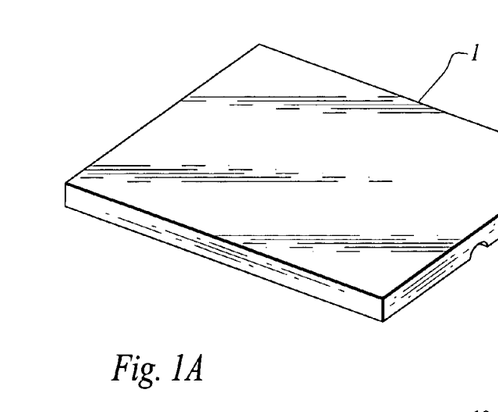
FIGS. 1A and 1B are a perspective view of ball grid array integrated circuit chip package illustrating, respectively, the top of the package and the ball grid array on the underside thereof.
Figure 1B:
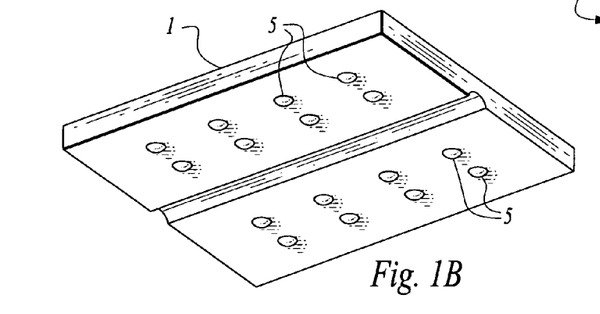

Referring now to the figures where like numerals designate like elements among the several views, FIGS. 1A and 1B show the top and underside, respectively, of an integrated circuit die package, here a conventional ball grid array (BGA) packaged memory device 1 which includes solder balls 5 for electrical communication of signals and power into and out of the BGA package. Conventional BGA memory packages in fine grid array or micro grid array are readily available from a variety of commercial sources such as MICRON TECHNOLOGIES, INC. or SAMSUNG CORP.

Figure 2:
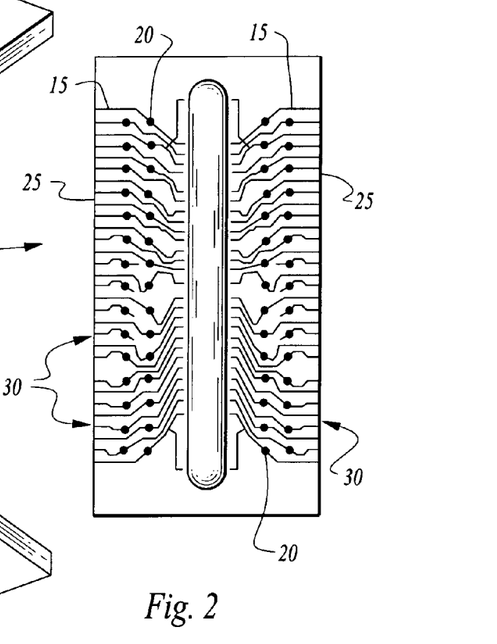
FIG. 2 plan view of an interposer board with exemplar conductive traces, access leads and solder ball pads formed thereon.

FIG. 2 illustrates an interposer board 10 made of a dielectric material such as BT Resin from Mitsubishi and includes conductive traces 15. Conductive traces 15 include solder ball pads 20 for the receiving of solder balls 5. Conductive traces lead to and terminate at an access edge 25 on the interposer board to form access leads 30.

Conductive traces made of copper or other conductive material are formed on the interposer board in a manner similar to that used in printed circuit board manufacturing. The conductive traces are patterned on the interposer board using conventional photolithography techniques so as to form solder ball pads 20 for the receiving and electrical connection of solder balls 5. The interposer board may include a single layer of conductive traces 15 or, in an alternative embodiment, multiple layers of conductive traces (not shown).

Figure 3:
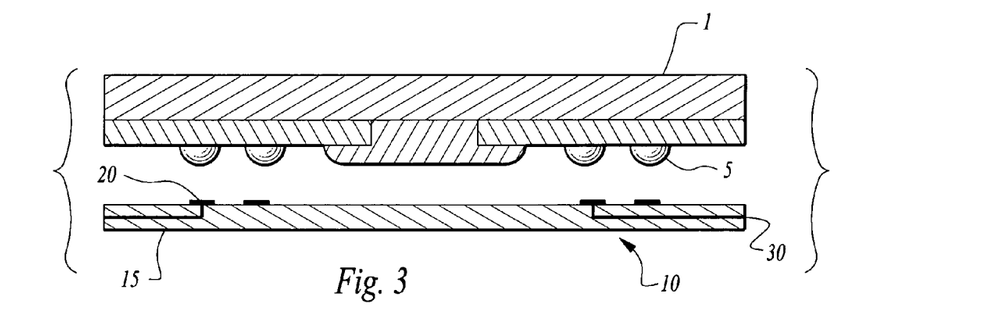
FIG. 3 is a front sectional view of a ball grid array package and interposer board showing the conductive traces, solder balls and solder ball pads.

To assemble the device, solder balls 5 of BGA package 1 are aligned and electrically connected to solder ball pads 20 as is shown in FIG. 3. An alternative embodiment includes the use of fine grid BGA packages or even bare die that include ball bonds or that are adapted to be received by the solder ball pads. The BGA package and interposer board are then reflow-soldered using conventional reflow solder techniques. While the solder balls will self-align with the solder ball pads during solder reflow, reflow process controls are critical during soldering, particularly when utilizing fine pitch ball grid array packages. Solder reflow process controls such as those set forth in "MICRON TECHNOLOGY INC. Technical Note TN-00-11 SMT BGA Assembly Design Recommendations" provide guidance for BGA reflow solder processes.

Figure 4:
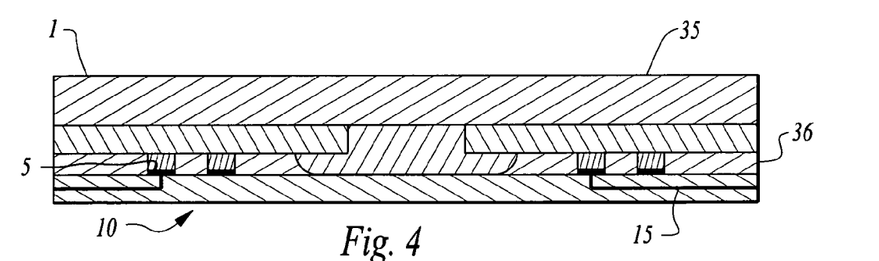
FIG. 4 is a side sectional view of a ball grid array package and interposer board after the elements have been soldered together and under-filled, creating a stackable layer.

Upon completion of the reflow process, a stackable BGA layer 35 is formed as is illustrated in FIG. 4. The layer is then preferably under-filled with a suitable under-fill material 36 such as EPOTEK U-300 to provide structural stability and to minimize temperature-related stresses due to CTE mismatch of the interposer board and BGA package. It is preferable to provide sufficient under-fill so as to extend slightly beyond the edge of the BGA package and interposer board as the under-fill eliminates voids along the access edge 25 which will be utilized as discussed further below.

Figure 5:
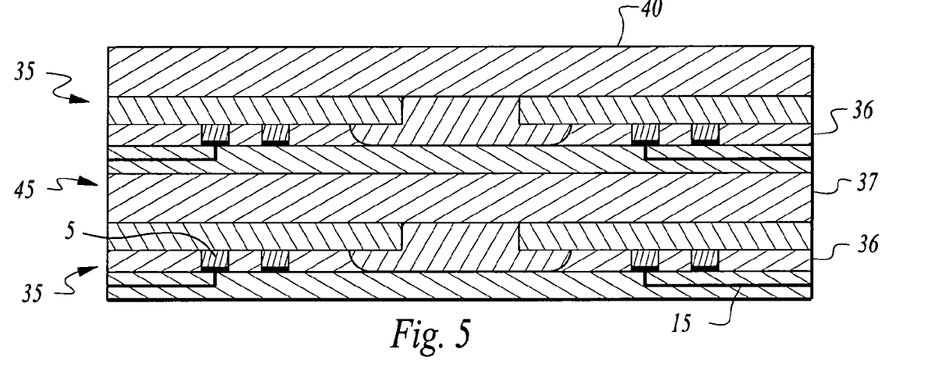
FIG. 5 is a side sectional view of a stack of layers that have been under-filled and bonded and connected a bottom interposer board.

Turning now to FIG. 5, multiple layers 35 may be bonded together using a suitable adhesive or epoxy 37 such as EPOTEK 353 to form a three-dimensional stack 40 of layers 35, forming at least one access plane 45.

Figure 6:
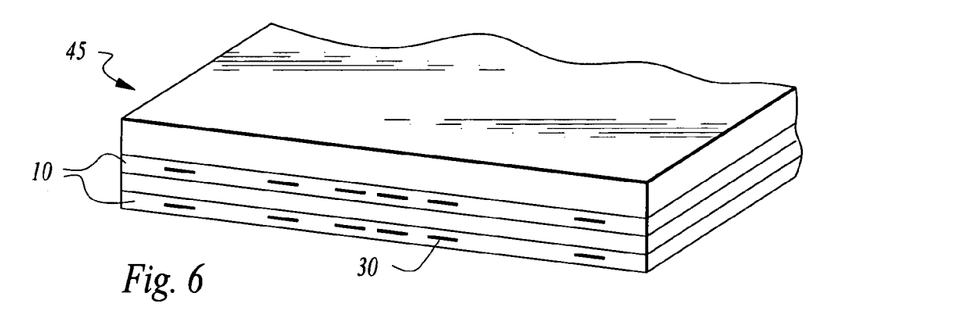
FIG. 6 shows a side view of stack of layers illustrating an access plane with access leads exposed after lapping.

Mechanical assembly of multiple layers consists generally of aligning two or more layers 35 in a suitable fixture and bonding together using the appropriate adhesive. After the adhesive has cured, the sides of stack 40 that include access leads 30, i.e., access plane 45, are ground and lapped to expose the access leads as is illustrated in FIG. 6.

Figure 7:
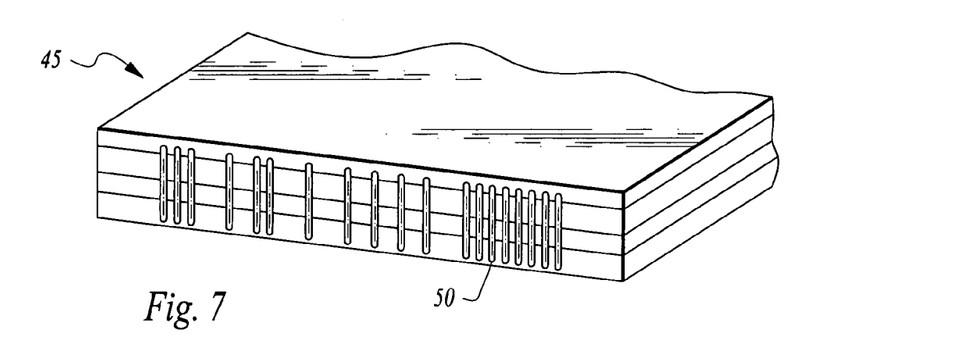
FIG. 7 shows a side view of stack of layers illustrating an access plane with access lead interconnections between access leads on different layers.

FIG. 7 shows how access leads 30 may be rerouted between layers as desired by using conventional photolithography and plating techniques to create conductive interconnecting metallic buses or traces 50. Alternatively, the entire access plane 45 may be metallized or coated with conductive material and the desired access leads isolated or interconnected by selectively removing conductive material using laser ablation, saw-cutting, etching or similar process. It is important that access plane be very planar with no voids to ensure the integrity of the layer interconnects. The stack is preferably encapsulated with a suitable encapsulant to protect interconnecting traces 50.

Figure 8:
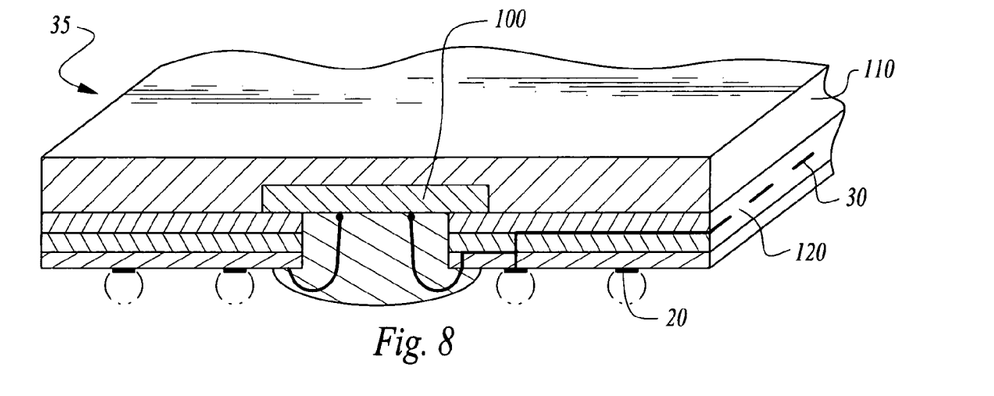
FIGS. 8, 9 and 10 illustrate cross-sections of different ball grid array packaging formats.
Figure 9:
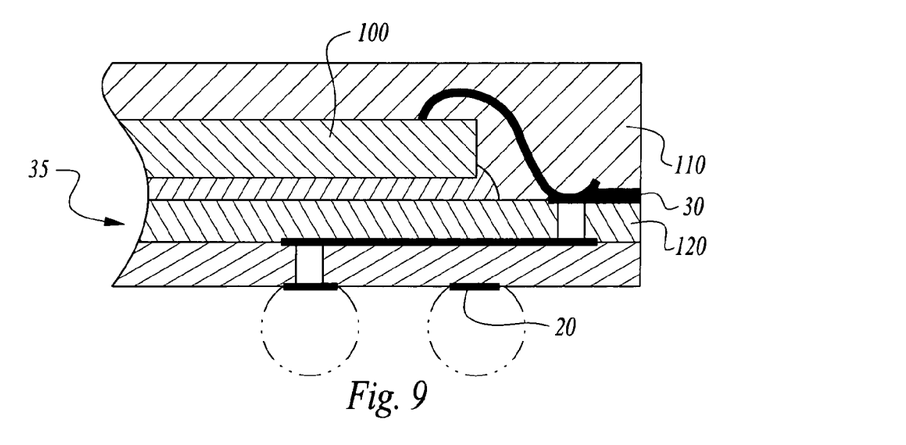
Figure 10:
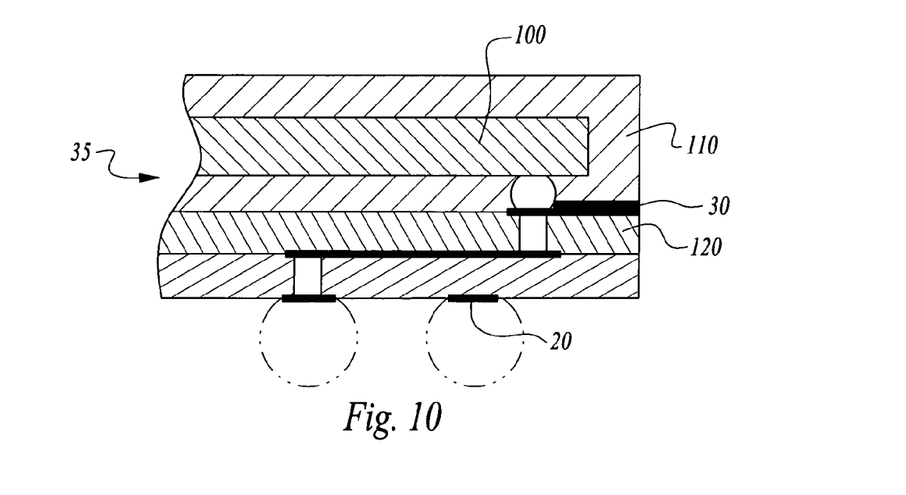

In an alternative preferred embodiment, shown in FIGS. 8, 9 and 10, the use of a separately fabricated interposer board 10 may be avoided by providing a prefabricated stackable layer 35 comprising a known good die (KGD) wherein access leads 30 are integrated within and as part of the internal structure of stackable layer 35 and are accessible on a lateral surface of the layer.

FIGS. 8, 9 and 10 show a cross-section of typical BGA packaging formats illustrating an integrated circuit die 100, an encapsulant 110 and an internal printed circuit structure 120 used for the routing of electrical signals from die 100 to solder ball pads 20 accessible on the lower major surface of the layer. As in well-known in the art of ball grid array manufacturing, die 100 (preferably a burned-in and pretested, aka known good die) is electrically connected to an internal printed circuit structure by means of, for instance, wire bonds, solder, conductive epoxy or flip chip means such that the bond pads of the die are in electrical connection with solder ball pads 20 as part of the ball grid array manufacturing process. The entire assembly is encapsulated in a suitable encapsulant such that the solder ball pads are accessible for receiving a solder ball if desired . . . .

In the illustrated embodiments of FIGS. 8, 9 and 10, at least one of the solder ball pads 20 is also electrically accessible on a lateral surface of the stackable layer 35 by means of an access lead 30. The embodiments of FIGS. 8, 9 and 10 of the stackable layer 35 of the invention may be provided with or without solder balls 5 on solder ball pads 20. As seen in FIGS. 8, 9 and 10, conductive access leads 30 are disposed on a lateral surface of stackable layer 35 for interconnection to another stackable layer 35 in a stack of layers 40 using, for instance, metallized T-connect structures.

Such a package format can optionally be manufactured with access leads 30 exposed on a lateral surface or, alternatively, in a form where a predetermined portion of the encapsulant of the package is removed by the user as described above to expose access leads 30.

When provided in this embodiment, the stackable layers 35 can optionally have solder balls applied to solder ball pads 20 and be used in conventional ball grid array applications. Alternatively the stackable layers may be provided without solder balls and be stacked with the base reroute substrate 130 of FIG. 11 and electrically interconnected by means of a metallized trace 50 to define a T-connect 140 of FIG. 12 on access plane 45 and access leads 30 to form a three-dimensional module 40.

Figure 11:
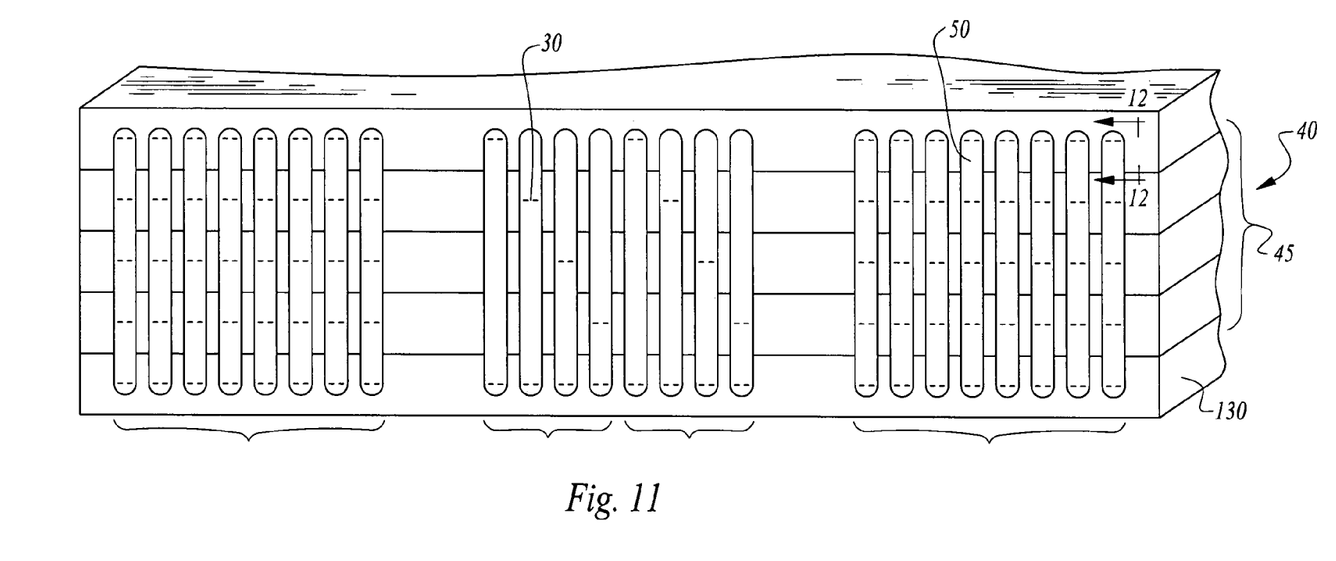
FIG. 11 shows a stack of layers wherein the layers comprise prefabricated access leads formed as part of the internal printed circuit structure of the layer.
Figure 12:
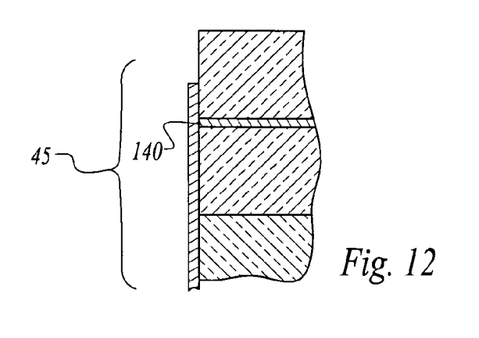
FIG. 12 is a cross section of a T-connect structure.
Figure 13:
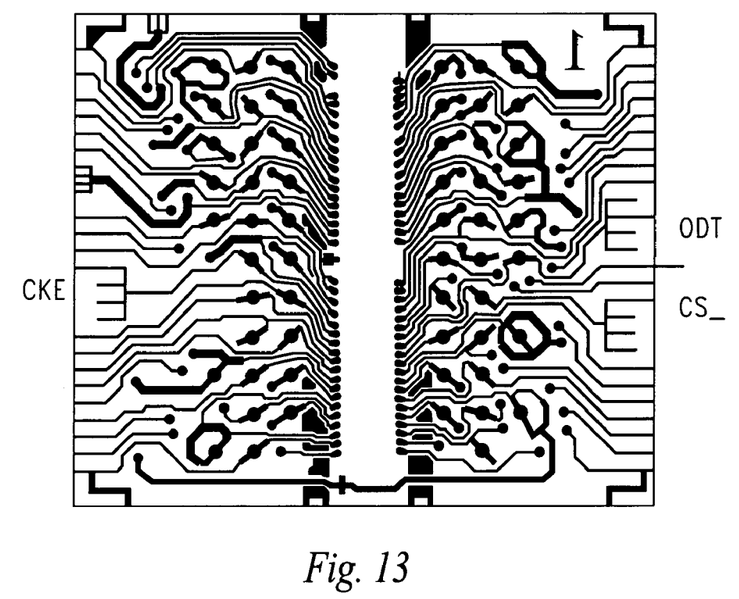
FIGS. 13, 14, 15 and 16 illustrate a preferred embodiment of different internal printed circuit structures of the layers of FIG. 11.
Figure 14:
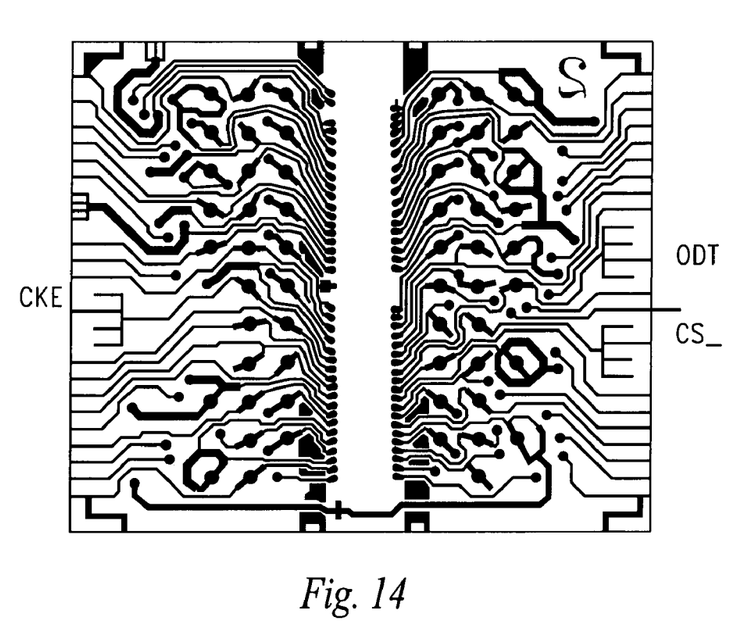
Figure 15:
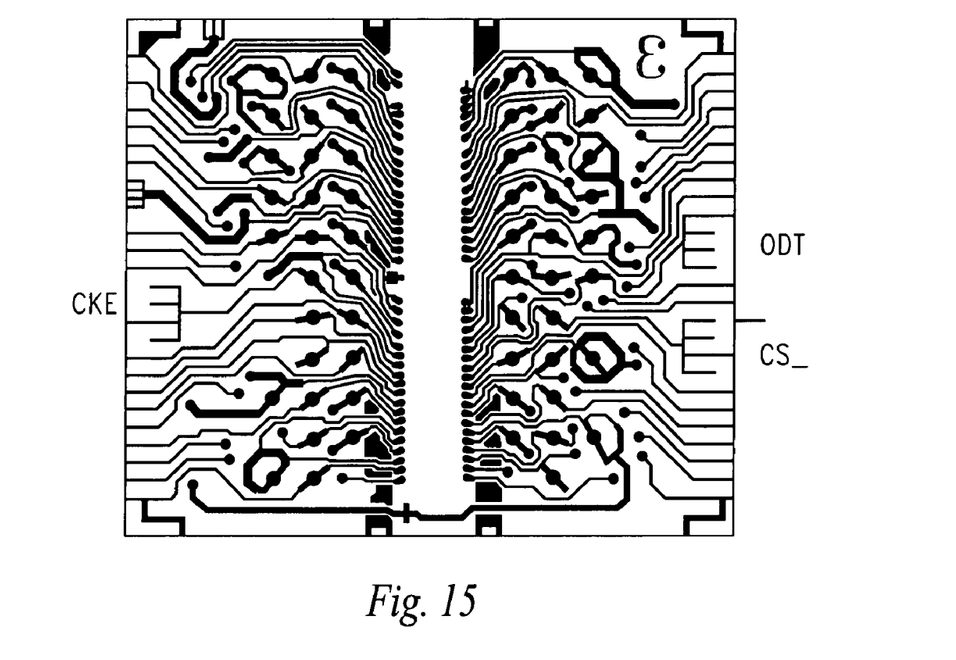
Figure 16:
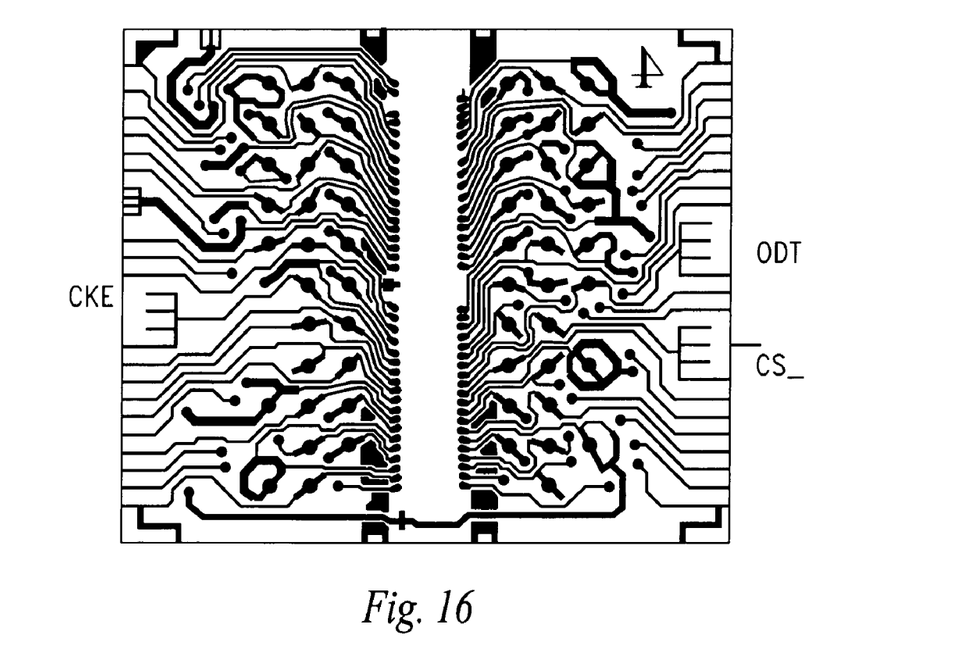

In the preferred embodiment of FIG. 11, incorporating, for instance, DDR2 memory chips, a plurality of stackable layers 35 without solder balls are bonded to form a stacked electronic module 40. Each layer 35 comprises an encapsulated integrated circuit die 100 bonded to an internal printed circuit structure 120 comprised of a plurality of conductive traces, certain or all of which terminate on a lateral surface to define one or more access leads 30. One or more access leads 30 are electrically accessible on the lower surface of the layer on a corresponding solder ball pad 20. Solder ball pad 20 may selectively be provided with or without a solder ball but, in the illustrated embodiment, is provided without a solder ball to facilitate stacking.

Each internal printed circuit structure 120 in the stack comprises at least one impedance controlled, layer-specific access lead (CS and ODT in this instance) to allow selective layer circuitry control of a particular chip function by a user. The respective layer control access leads are horizontally off-set by a predetermined distance upon the selected lateral or longitudinal surface to allow the electrical isolation of a metallic trace or bus 50 upon the surface. Each layer-specific internal conductive structure is preferably designed whereby predetermined layer-specific impedance requirements are considered to optimize circuit performance.

Turning to FIGS. 13 through 16 of the illustrated embodiment, it is noted that selected layer-specific (e.g., Layers 1-4) access leads, in this case Clock Enable (CE), On Die Termination (ODT) and Chip Select (CS) access leads are each offset a predetermined horizontal distance (i.e., staggered) on the respective lateral surface. When assembled as a stack of layers as illustrated in FIG. 11, the aforementioned signal lines are accessible using the metallized traces 50 and T-connect structures 140 of FIG. 12 on a layer-by-layer basis while user-defined other access leads (e.g., Address or Data lines, VDD, VSS) on each of the layers are in vertical registration with each other to allow common electrical connection for each layer in the stack.

In this manner, when a plurality of stackable layers are bonded into an integral module wherein a substantially planar lateral surface is defined, a set of conductive traces may be defined thereon that provide a common electrical connection to all layers (e.g., address or data lines, VDD, VSS) and layer-specific control traces are electrically isolated so that preselected chip functions may be individually performed or controlled.

In this manner a high capacity, multi-layer module is provided that is low cost and which is readily received into existing BGA footprints.

From the foregoing description, it will be apparent the apparatus and method disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact the elements of a claim are set forth below in a certain combination, it must be expressly understood that the invention includes other combinations of fewer, more or different elements, which are disclosed above even though not claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus, if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a sub-combination or variation of a sub-combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. A stackable layer comprising:
   a ball grid array format integrated circuit package including a molded encapsulating material and having a lower major surface, wherein:
   the molded encapsulating material defines a plurality of planar lateral surfaces on the ball grid array format integrated circuit package;
   the ball grid array format integrated circuit package further comprises an integrated circuit die having at least one bond pad in electrical connection with an internal printed circuit structure;
   the internal printed structure includes at least one access lead defined thereon and aligned coplanar with at least one of the plurality of planar lateral surfaces of the encapsulating material;
   at least one of the plurality of planar lateral surfaces of the encapsulating material has at least one of the access leads disposed thereon; and
   the lower surface has at least one conductive pad in electrical connection with one of the bond pads and suitable for receiving a solder ball.

2. The stackable layer of claim 1 wherein the stackable layer is in the form factor of a ball grid array package.

3. The stackable layer of claim 1 wherein the at least one conductive pad comprises a solder ball disposed thereon.

4. The stackable layer of claim 1 wherein the one of the bond pads is electrically connected to the at least one conductive pad by a wirebond.

5. The stackable layer of claim 1, wherein the one of the bond pads is electrically connected to the at least one conductive pad by a ball bond.

6. An electronic module comprising a stack of layers wherein at least two of the layers each include:
   a ball grid array format integrated circuit package comprising a molded encapsulating material and having a lower major surface, wherein:
   the molded encapsulating material defines a plurality of planar lateral surfaces on the ball grid array format integrated circuit package;
   the ball grid array format integrated circuit package includes an integrated circuit die having at least one bond pad in electrical connection with an internal printed circuit structure;
   the internal printed structure comprises at least one access lead defined thereon and aligned coplanar with at least one of the plurality of planar lateral surfaces of the encapsulating material;
   at least one of the plurality of planar lateral surfaces of the encapsulating material has at least one of the access leads disposed thereon; and
   the lower surface has at least one conductive pad in electrical connection with one of the bond pads and suitable for receiving a solder ball.

7. A stackable layer comprising: an integrated circuit package including:

a molded encapsulating material formed around at least a portion of an integrated circuit die;

an internal printed circuit structure electrically connected to a bond pad of the integrated circuit die and comprising a first access lead, wherein at least a portion of the first access lead is disposed on a lateral surface of the integrated circuit package and is configured for electrical connection with a second stackable layer; and a conductive pad disposed on an outer surface of the integrated circuit package, wherein the conductive pad is electrically connected to the bond pad and the first access lead;

wherein the internal printed circuit structure further comprises a second access lead offset and electrically isolated from the first access lead.

8. The stackable layer of claim 7, wherein the integrated circuit package is a ball grid array integrated circuit package.

9. The stackable layer of claim 7, wherein the integrated circuit die is a pretested integrated circuit die.

10. The stackable layer of claim 7, wherein the integrated circuit package includes a conductive T-connect structure electrically connected to the first access lead and configured to form an electrical connection with the second stackable layer.

11. The stackable layer of claim 7, further comprising a solder ball coupled to the conductive pad.

12. The stackable layer of claim 7, wherein the conductive pad is electrically connected to the bond pad by a wire bond.

13. The stackable layer of claim 7, wherein the conductive pad is electrically connected to the bond pad by a ball bond.

14. The stackable layer of claim 7, Wherein the integrated circuit die comprises a DDR2 memory chip.

15. The stackable layer of claim 7, wherein the internal printed circuit structure further comprises a plurality of conductive traces, and wherein at least one of the plurality of conductive traces is electrically connected to the first access lead.

16. An electronic module comprising:

a first layer;

a second layer electrically connected to the first layer; and a conductive trace disposed on a lateral surface of the electronic module and configured to electrically connect the first layer to the second layer;

wherein the first layer includes:

a first encapsulating material formed around at least a portion of a first integrated circuit die;

a first internal printed circuit structure electrically connected to a first bond pad of the first integrated circuit die and comprising a first access lead configured for electrical connection with the second layer, wherein at least a portion of the first access lead is disposed on a lateral surface of the first layer; and a first conductive pad disposed on an outer surface of the first layer and electrically connected to the first bond pad and the first access lead;

wherein the second layer includes:

a second encapsulating material formed around at least a portion of a second integrated circuit die;

a second internal printed circuit structure electrically connected to a second bond pad of the second integrated circuit die and comprising a second access lead configured for electrical connection with the first layer, wherein at least a portion of the second access lead is disposed on a lateral surface of the second layer; and a second conductive pad disposed on an outer surface of the second layer and electrically connected to the second bond pad and the second access lead; and wherein the conductive trace is electrically connected to the first access lead and the second access lead.

17. The electronic module of claim 16, further comprising a base reroute structure electrically connected to at least one of the first layer or the second layer via the conductive trace.

18. The electronic module of claim 16, wherein the conductive trace is electrically connected to the first access lead and the second access lead via a conductive T- connect structure.

19. The electronic module of claim 16, wherein at least one of the first layer or the second layer comprises a memory chip.

20. The electronic module of claim 16, wherein at least one of the first integrated circuit die or the second integrated circuit die is pretested.

21. A method of forming a stackable layer, the method comprising:

disposing an encapsulating material around at least a portion of an integrated circuit die to create an integrated circuit package, wherein the integrated circuit package includes an internal printed circuit structure;

removing a portion of the encapsulating material to expose a first access lead of the internal printed circuit structure; and electrically connecting the integrated circuit die to the internal printed circuit structure, wherein the first access lead of the internal printed circuit structure is electrically connected to a conductive pad formed on an outer surface of the integrated circuit package and to a bond pad formed on the integrated circuit die;

wherein at least a portion of the first access lead is disposed on a lateral surface of the integrated circuit package and is configured for electrical connection with a second stackable layer.

22. The method of claim 21, further comprising:

forming a conductive trace on the lateral surface of the integrated circuit package; and electrically connecting the first access lead to the conductive trace, wherein the conductive trace is electrically connected to a second access lead of a second integrated circuit package.

23. The method of claim 22, wherein the conductive trace is electrically connected to the first access lead using a conductive T-connect structure.

24. The method of claim 21, wherein the integrated circuit package is a ball grid array integrated circuit package.

25. The method of claim 21, wherein the integrated circuit die is a pretested integrated circuit die.

26. The method of claim 21, further comprising coupling a solder ball to the conductive pad.

27. The method of claim 21, further comprising electrically connecting the conductive pad to the bond pad using a wire bond or a ball bond.

28. The method of claim 21, further comprising forming a plurality of conductive traces within the internal printed circuit structure and electrically connecting at least one of the plurality of conductive traces to the first access lead.

29. A method of forming a stackable layer, the method comprising:

disposing an encapsulating material around at least a portion of an integrated circuit die to create an integrated circuit package, wherein the integrated circuit package includes an internal printed circuit structure; and electrically connecting the integrated circuit die to the internal printed circuit structure, wherein the internal printed circuit structure includes a first access lead electrically connected to a conductive pad formed on an outer surface of the integrated circuit package and to a bond pad formed on the integrated circuit die; and forming a second access lead in the internal printed circuit structure, wherein the second access lead is offset and electrically isolated from the first access lead;

wherein at least a portion of the first access lead is disposed on a lateral surface of the integrated circuit package and is configured for electrical connection with a second stackable layer.

* * * * *